(12) United States Patent
Maeda

(10) Patent No.: US 9,176,195 B2
(45) Date of Patent: Nov. 3, 2015

(54) METHOD OF DETECTING BATTERY DEGRADATION LEVEL

(75) Inventor: Reizo Maeda, kasai (JP)

(73) Assignee: SANYO ELECTRIC CO., LTD., Osaka (JP)

( * ) Notice: Subject to any disclaimer, the term of this patent is extended or adjusted under 35 U.S.C. 154(b) by 316 days.

(21) Appl. No.: 13/976,679

(22) PCT Filed: Dec. 27, 2011

(86) PCT No.: PCT/JP2011/080350
§ 371 (c)(1),
(2), (4) Date: Jun. 27, 2013

(87) PCT Pub. No.: WO2012/091077
PCT Pub. Date: Jul. 5, 2012

(65) Prior Publication Data
US 2013/0271148 A1    Oct. 17, 2013

(30) Foreign Application Priority Data
Dec. 28, 2010 (JP) .................... 2010-294055

(51) Int. Cl.
*H01M 10/44* (2006.01)
*G01R 31/36* (2006.01)
(Continued)

(52) U.S. Cl.
CPC .......... *G01R 31/3606* (2013.01); *B60L 3/0046* (2013.01); *B60L 8/003* (2013.01); *B60L 11/1803* (2013.01); *B60L 11/1816* (2013.01); *B60L 11/1857* (2013.01); *B60L 11/1859* (2013.01); *B60L 11/1861* (2013.01); *G01R 31/3679* (2013.01); *H01M 10/48* (2013.01); *H02J 7/0047* (2013.01); *B60L 2210/10* (2013.01); *B60L 2240/545* (2013.01); *B60L 2240/547* (2013.01); *B60L 2240/549* (2013.01);
(Continued)

(58) Field of Classification Search
CPC ...... H02J 7/0021; H02J 7/0047; G01N 27/27; G01N 27/416; G01N 27/4161
USPC .......... 324/426, 427, 433; 320/101, 104, 127, 320/128, 132, 149; 429/90, 91, 92; 702/63, 702/64
See application file for complete search history.

(56) References Cited

U.S. PATENT DOCUMENTS 3,775,675 A * 11/1973 Freeze et al. .................. 324/547
3,940,679 A *  2/1976 Brandwein et al. ........... 320/134
(Continued)

FOREIGN PATENT DOCUMENTS

| JP | 2008-122165 | 5/2008 |
| JP | 2008-228492 | 9/2008 |
| JP | 2009-207312 | 9/2009 |

OTHER PUBLICATIONS

International Search Report issued Apr. 10, 2012 in International Application No. PCT/JP2011/080350.

*Primary Examiner* — Edward Tso
(74) *Attorney, Agent, or Firm* — Wenderoth, Lind & Ponack, LLP.

(57) ABSTRACT

A method of detecting battery degradation level detects charging and discharging current flow in the battery and determines battery degradation level (state of health, SOH) from the charging and discharging current. The method detects the battery degradation level (SOH) from the root-mean-square of the charging and discharging current flow ($I_{rms}$) in the battery, which is designated effective current.

10 Claims, 9 Drawing Sheets

(51) Int. Cl.
*B60L 3/00* (2006.01)
*B60L 8/00* (2006.01)
*B60L 11/18* (2006.01)
*H01M 10/48* (2006.01)
*H02J 7/00* (2006.01)
*H02J 7/35* (2006.01)
*H01M 10/46* (2006.01)

(52) U.S. Cl.
CPC ........ *G01R 31/3624* (2013.01); *G01R 31/3662* (2013.01); *H01M 10/465* (2013.01); *H01M 10/486* (2013.01); *H01M 2220/20* (2013.01); *H02J 7/35* (2013.01); *Y02T 10/705* (2013.01); *Y02T 10/7005* (2013.01); *Y02T 10/7044* (2013.01); *Y02T 10/7083* (2013.01); *Y02T 10/7216* (2013.01); *Y02T 90/127* (2013.01); *Y02T 90/14* (2013.01)

(56) References Cited

U.S. PATENT DOCUMENTS

2008/0224667 A1  9/2008  Tanaka et al.
2013/0278221 A1*  10/2013  Maeda .......................... 320/134

\* cited by examiner

METHOD OF DETECTING BATTERY DEGRADATION LEVEL

BACKGROUND OF THE INVENTION

1. Field of the Invention

The present invention relates to a method of detecting battery degradation level, and in particular to a method of detecting degradation level optimally suited for a battery used in a power source apparatus that drives an electric-powered vehicle or a battery used in a solar cell power storage unit.

2. Description of the Related Art

A rechargeable battery degrades with charge-discharge cycle repetitions and the capacity to which it can be charged decreases. Since degradation increases due to over-charging and over-discharging, degradation can be reduced and battery lifetime extended by preventing over-charging and over-discharging, and by limiting charging and discharging operation in regions close to over-charging and over-discharging. To implement this type of operation and achieve reduced degradation and increased lifetime in a battery that drives a vehicle such as a hybrid vehicle (HV, hybrid car, hybrid electric vehicle, HEV), the battery is charged and discharged within a specified range of residual capacity (state-of-charge, SOC [%]). For example, battery charging and discharging can be controlled within a residual capacity (SOC [%]) range of 50%±20%. To control charging and discharging and keep the residual capacity (SOC [%]) within a specified range, it is necessary to detect the full-charge capacity. This is because residual capacity (SOC [%]) is represented by the ratio of the amount of charge (Ah) capable of being discharged to the full charge capacity (Ah). The full-charge capacity can be determined by integrating the discharge current when the battery is discharged from a fully-charged state to a completely discharged state. Or, the full-charge capacity can be determined by integrating the charging current required to fully-charge the battery from a completely discharged state. However, full-charge capacity determination by these methods requires the battery either to be charged from a fully discharged state to a fully-charged state or to be discharged from a fully-charged state to a completely discharged state. For a battery used in an operating environment that does not completely discharge or fully-charge the battery, full-charge capacity cannot be detected by simply integrating the discharge current or charging current. For example, in a hybrid vehicle application, the vehicle cannot be driven by the battery if it is completely discharged, and the battery cannot be charged by regenerative braking if it is fully-charged. Further, for a battery charged by solar cells, solar cell output depends on weather conditions and battery discharge depends on load requirements. Consequently, it can be difficult to operate in a fully-charged state or completely discharged state in a solar cell power storage application as well.

Since full-charge capacity cannot be determined by integrating current in applications that limit battery degradation by controlling charging and discharging within a given residual capacity (SOC [%]) range, an alternate method of determining full-charge capacity is required. Charging and discharging cannot be controlled within a specified range of residual capacity (SOC [%]) if the full-charge capacity is not accurately detected. Consequently, accurate detection of the full-charge capacity is necessary for this type of limited charge-capacity-range operation. Since batteries have the property that full-charge capacity changes as battery degradation proceeds, full-charge capacity can be detected by accurately detecting the degree of battery degradation. Consequently, accurate determination of the level of battery degradation is particularly important for a battery that has its charging and discharging controlled within a given residual capacity range.

A method of integrating battery charging and discharging current has been developed to detect battery degradation level.

Refer to Japanese Laid-Open Patent Publication 2008-228492

According to the rechargeable battery charging method cited in JP 2008-228492 A, battery charging current is integrated and saved in a cumulative manner, each time the cumulative integrated value becomes equal to the full-charge capacity of the battery, it is counted as one cycle, and the battery degradation level is determined as the cumulative cycle count increases. This method detects battery degradation level from the integrated charging current. Specifically, the battery is assumed to degrade as the integrated charging current increases, and that relation is used to detect the degradation level.

Although the disclosed method detects degradation level from the integrated current, battery degradation level is not determined exclusively by the integrated current value, and different degradation levels can result even when the integrated current value is the same. For the case where the integrated current values are the same, degradation level is larger for varying current conditions than for constant current conditions. For example, when 10 A of current flows for 10 sec, the integrated current value is 100 Asec, and when a current peak of 100 A flows for 1 sec while no current flows for the remaining 9 sec, the integrated current value is also 100 Asec. However, the battery degradation level for a 100 A peak current flow is greater than that for constant 10 A current flow conditions. As a result, a method that detects degradation level based only on integrated current values has the drawback that an accurate battery degradation level cannot always be determined.

The present invention was developed to further resolve the drawback described above. Thus, it is a primary object of the present invention to provide a method of detecting battery degradation level that can more accurately detect the degradation level from the battery current.

SUMMARY OF THE INVENTION

The method of detecting battery degradation level of the present invention detects charging and discharging current flow in the battery and determines battery degradation level (state of health, SOH) from the charging and discharging current. The method detects the battery degradation level (SOH) from effective current ($I_{rms}$), which is the root-mean-square of the charging and discharging current flowing in the battery.

Since this method does not detect degradation level (SOH) from the integrated average current flow in the battery, but rather from the effective value of charging and discharging current ($I_{rms}$), it can more accurately determine degradation level (SOH) from the battery current. This is because even for the same integrated battery current value, the degradation level is greater for fluctuating current than for current flow that is constant on average.

The method of detecting battery degradation level of the present invention can detect battery degradation level (SOH) from the cumulative value of the effective value of charging and discharging current ($I_{rms}$) flow in the battery. Since this method detects battery degradation level (SOH) from the cumulative value of effective current ($I_{rms}$), the degradation level (SOH) can be determined while reducing the number of times SOH is detected from effective current ($I_{rms}$). Specifically, by making the time period over which effective current ($I_{rms}$) is accumulated greater than the period for effective current ($I_{rms}$) detection, the degradation level (SOH) can be detected while reducing the number times it is detected.

The method of detecting battery degradation level of the present invention can detect the cumulative value of the effective value of charging and discharging current ($I_{rms}$) with a constant accumulation time. Since this method detects degradation level (SOH) from effective current ($I_{rms}$) values accumulated over a pre-set constant time period, the degradation level can be determined in a simple manner.

The method of detecting battery degradation level of the present invention can detect the cumulative value of effective value of charging and discharging current ($I_{rms}$) with accumulation times set coincident with charging and discharging time intervals. Since this method accumulates effective current ($I_{rms}$) with time intervals set optimally for a battery being charged and discharged, degradation level (SOH) can be determined in a simple and accurate manner.

The method of detecting battery degradation level of the present invention can detect battery degradation level (SOH) from effective value of charging and discharging current ($I_{rms}$) and accumulated time that a pre-set current limit is exceeded. Since this method does not detect degradation level (SOH) exclusively by effective current ($I_{rms}$) but rather by both effective current ($I_{rms}$) and accumulated time exceeding the current limit, degradation level (SOH) can be detected more accurately.

The method of detecting battery degradation level of the present invention can detect battery degradation level (SOH) from the root-mean-squared charging and discharging current ($I_{rms}$) and accumulated time that pre-set upper and lower voltage limits are exceeded. Since this method detects degradation level (SOH) considering the accumulated time that upper and lower voltage limits are exceeded in addition to effective current ($I_{rms}$), degradation level (SOH) can be detected more accurately.

The method of detecting battery degradation level of the present invention can detect battery charging and discharging current with a sampling period of 1 msec to 1 sec to determine root-mean-squared current. Since this method detects battery current with a 1 msec to 1 sec sampling period, root-mean-squared effective current ($I_{rms}$) can be accurately determined from varying battery current flow for accurate detection of the degradation level (SOH).

The method of detecting battery degradation level of the present invention can be used in an application that controls battery charging and discharging within a pre-set residual capacity (SOC [%]) range. In this method of detecting degradation level, full-charge capacity is accurately detected from the battery degradation level (SOH), and with the detected full-charge capacity, battery operation can be controlled within a fixed residual capacity range. As a result, this method has the characteristic that battery over-charging and over-discharging can be reliably prevented allowing extended lifetime.

The method of detecting battery degradation level of the present invention can be applied to a battery that supplies power to a motor to drive a vehicle. In this method, full-charge capacity of a battery that supplies power to a motor is detected from the degradation level (SOH), and from the detected full-charge capacity, over-charging and over-discharging can be prevented to minimize degradation. Accordingly, this method has the characteristic that the battery can be used over a long lifetime.

The method of detecting battery degradation level of the present invention can be applied to a battery used in a power source that stores solar cell power. In this method, full-charge capacity of a battery charged by solar cells is accurately detected from the degradation level (SOH), and from the detected full-charge capacity, over-charging and over-discharging can be prevented to minimize degradation. Accordingly, this method has the characteristic that the lifetime of a high-cost battery can be extended. The above and further objects of the present invention as well as the features thereof will become more apparent from the following detailed description to be made in conjunction with the accompanying drawings.

DESCRIPTION OF EMBODIMENTS

The following describes embodiments of the present invention based on the figures. However, the following embodiments are merely specific examples of a method of detecting battery degradation level representative of the technology associated with the present invention, and the method of detecting battery degradation level of the present invention is not limited to the embodiments described below. Further, components cited in the claims are in no way limited to the components indicated in the embodiments.

Figure 1:
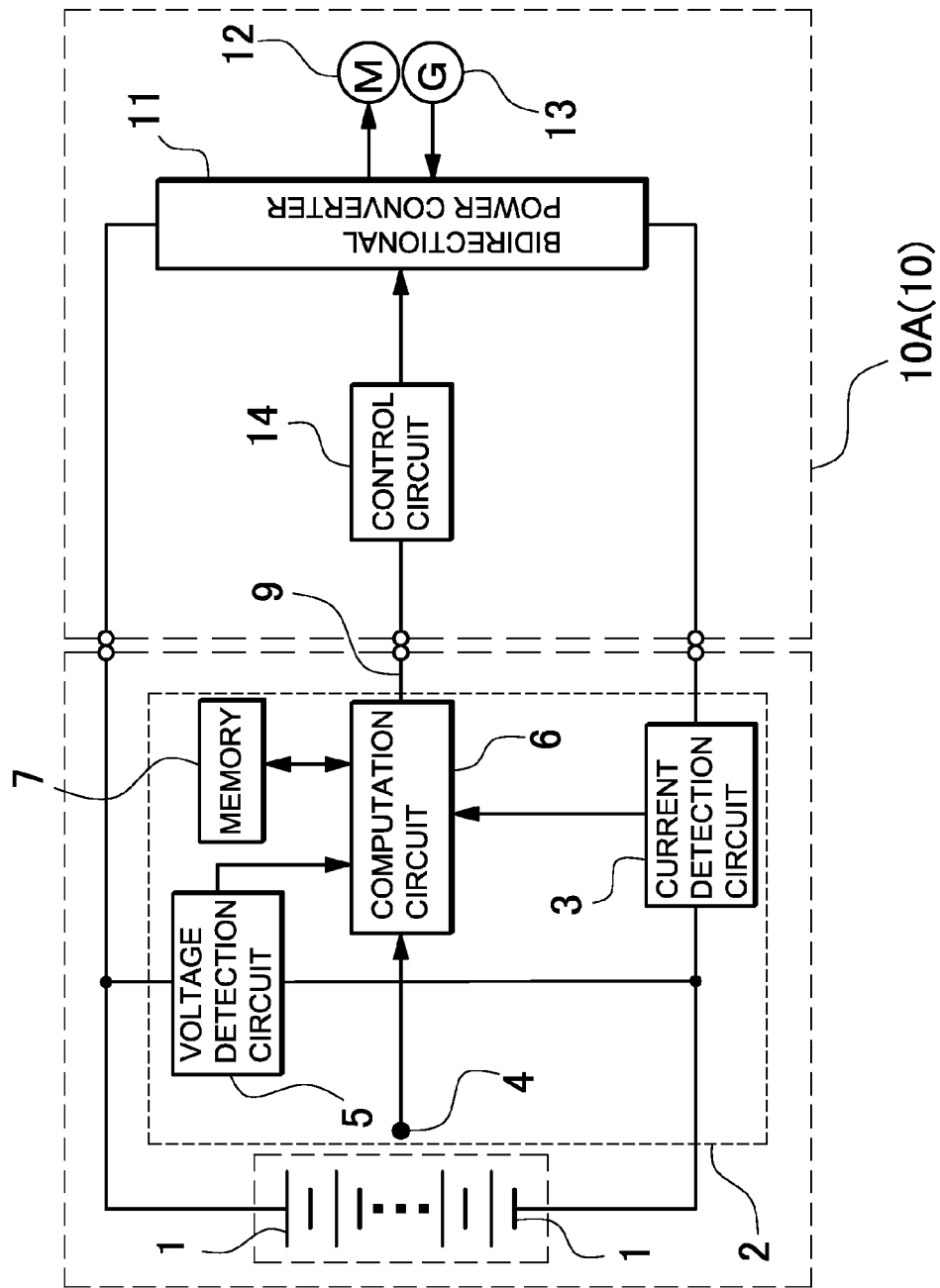
FIG. 1 is a block diagram showing an electric-powered vehicle power source apparatus used in the method of detecting battery degradation level for an embodiment of the present invention.
Figure 2:
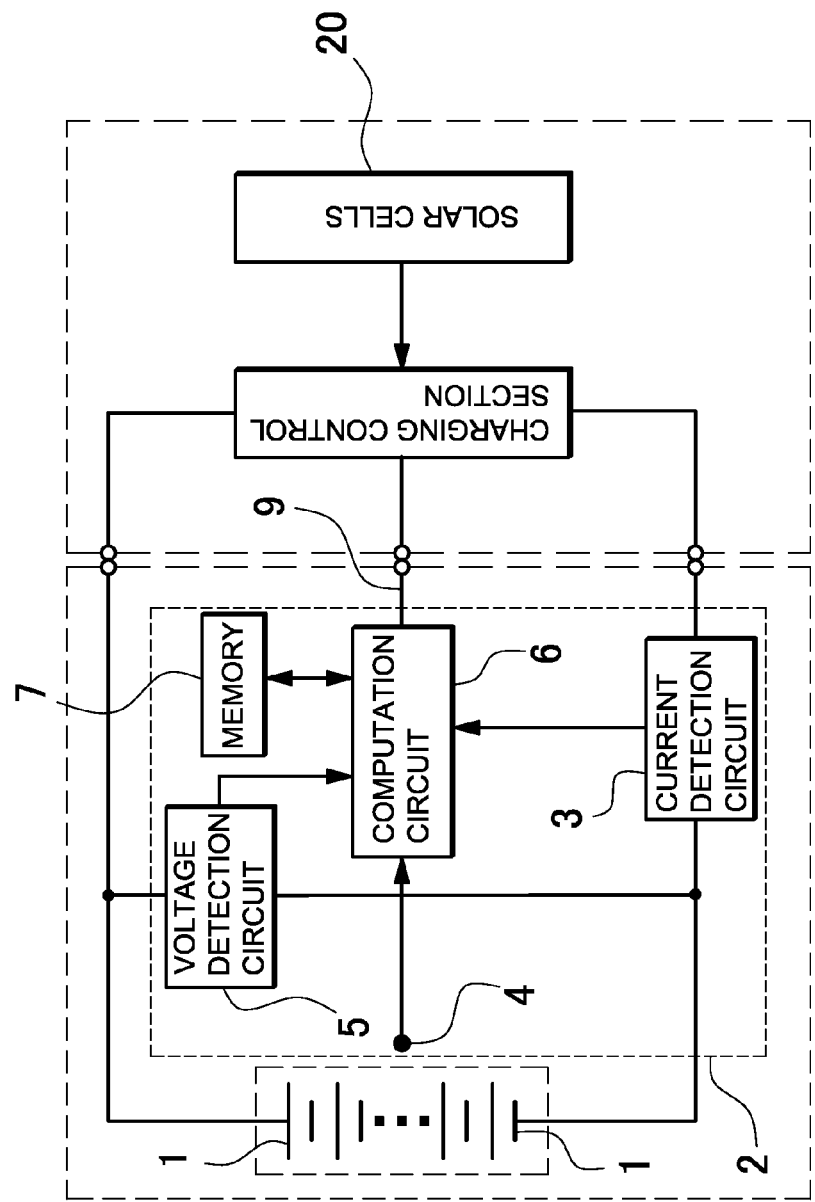
FIG. 2 is a block diagram showing a solar cell charged power source apparatus used in the method of detecting battery degradation level for one embodiment of the present invention.

FIGS. 1 and 2 are block diagrams of power source apparatus that use the method of detecting battery degradation level of the present invention. FIG. 1 shows a block diagram for determining the degradation level of a battery 1 installed on-board a hybrid vehicle 10A, and FIG. 2 shows a block diagram for determining the degradation level of a battery 1 charged by solar cells 20. However, the present invention is not limited to detecting degradation level of a battery applied in an electric-powered vehicle such as a hybrid vehicle, a plug-in hybrid electric vehicle, or electric vehicle (EV, electric automobile), or in a battery charged by solar cells. In a battery 1 used in an electric-powered vehicle such as a hybrid vehicle 10A or used with solar cells 20, full-charge capacity (Ah) is detected from the degradation level, and the residual capacity (SOC [%]) is computed from the ratio of the present battery capacity that can be discharged (Ah) to the detected full-charge capacity (Ah). This allows charging and discharging current to be controlled to keep the residual capacity (SOC [%]) within a specified range such as 50%±20%.

The battery 1 in the hybrid vehicle 10A application of FIG. 1 is discharged by supplying power to the vehicle driving motor 12 and is charged by a generator 13 to maintain the residual capacity near the 50% level. The battery 1 degradation level (SOH) is detected by a decision circuit 2.

The vehicle-side is provided with a bidirectional power converter 11 that supplies power from the battery 1 to the motor 12 and supplies generator 13 power to the battery 1. The bidirectional power converter 11 converts battery 1 direct current (DC) power to three-phase alternating current (AC) power to supply to the motor 12, and converts generator 13 AC output to DC to supply to the battery 1. The bidirectional power converter 11 is controlled by a control circuit 14 that controls power supplied from the battery 1 to the motor 12 and charging power from the generator 13 to the battery 1. The control circuit 14 controls the bidirectional power converter 11 considering the battery 1 degradation level (SOH), which is sent via communication lines 9 from the decision circuit 2 on the power source apparatus-side. When the battery 1 degradation level (SOH) is in a normally anticipated range, the control circuit 14 controls the bidirectional power converter 11 according to a normal-mode. However, when the battery 1 degradation level (SOH) is lower than that expected under normal conditions, the control circuit 14 controls the bidirectional power converter 11 according to a restricted-mode, which reduces charging and discharging power compared to the normal-mode. Conversely, when the battery 1 degradation level (SOH) is larger than that expected under normal conditions, the control circuit 14 controls the bidirectional power converter 11 according to an acceleration-mode, which increases charging and discharging power compared to the normal-mode, or according to the normal-mode. With this type of control of motor 12 input and generator 13 output by the control circuit 14 using the bidirectional power converter 11, battery 1 lifetime can approach a targeted number of years of service.

To detect the battery 1 degradation level (SOH), the decision circuit 2 is provided with a current detection circuit 3 that detects charging and discharging current flow through the battery 1, a temperature sensor 4 that detects battery 1 temperature, a voltage detection circuit 5 that detects battery 1 voltage, and a computation circuit 6 that computes battery 1 degradation level (SOH) from the values detected by the various detection circuits.

In addition, the decision circuit 2 houses electrically erasable programmable read-only memory (EEPROM) as memory 7 circuitry. The degradation level (SOH) is stored in EEPROM and transmitted to the vehicle-side control circuit 14 via the communication lines 9.

The current detection circuit 3 is provided with an analog-to-digital (A/D) converter (not illustrated) to convert detected analog current values to digital signals with a fixed sampling period. The current detection circuit 3 detects charging and discharging current with a constant sampling period, converts the detected values to digital signals, and outputs those signals to the computation circuit 6. The current detection circuit 3 detects battery 1 current with a sampling period of 1 msec to 10 msec. However, the current detection circuit sampling period is set to an optimal value according to the way that current flow varies in the battery. Specifically, the sampling period is set to an optimal value depending on whether current varies drastically over a short period or changes slowly over a long time, and for example, can be from 1 msec to 1 sec.

Rapidly fluctuating current can be detected more accurately by shortening the sampling period. However, a short sampling period requires faster A/D conversion and increases the parts-cost. In addition, since a short sampling period means the decision circuit 6 must process current signals faster, decision circuit 6 parts-cost also increases. Conversely, if the sampling period is too long, time-varying current may not be accurately detected. Accordingly, the sampling period for current detection is set to a time interval that can accurately detect the time-varying current.

The computation circuit 6 computes root-mean-squared effective current ($I_{rms}$) from digital signal current values input from the current detection circuit 3. The computation circuit 6 computes the root-mean-square of the current values to determine effective current ($I_{rms}$) according to the following equation:

$$\text{Effective current } (I_{rms}) = [(i_1^2 + i_2^2 + i_3^2 + \ldots + i_n^2)/n]^{1/2}$$

where $i_1, i_2, i_3, \ldots i_n$ are current values detected each sampling period by the current detection circuit 3.

Figure 3:
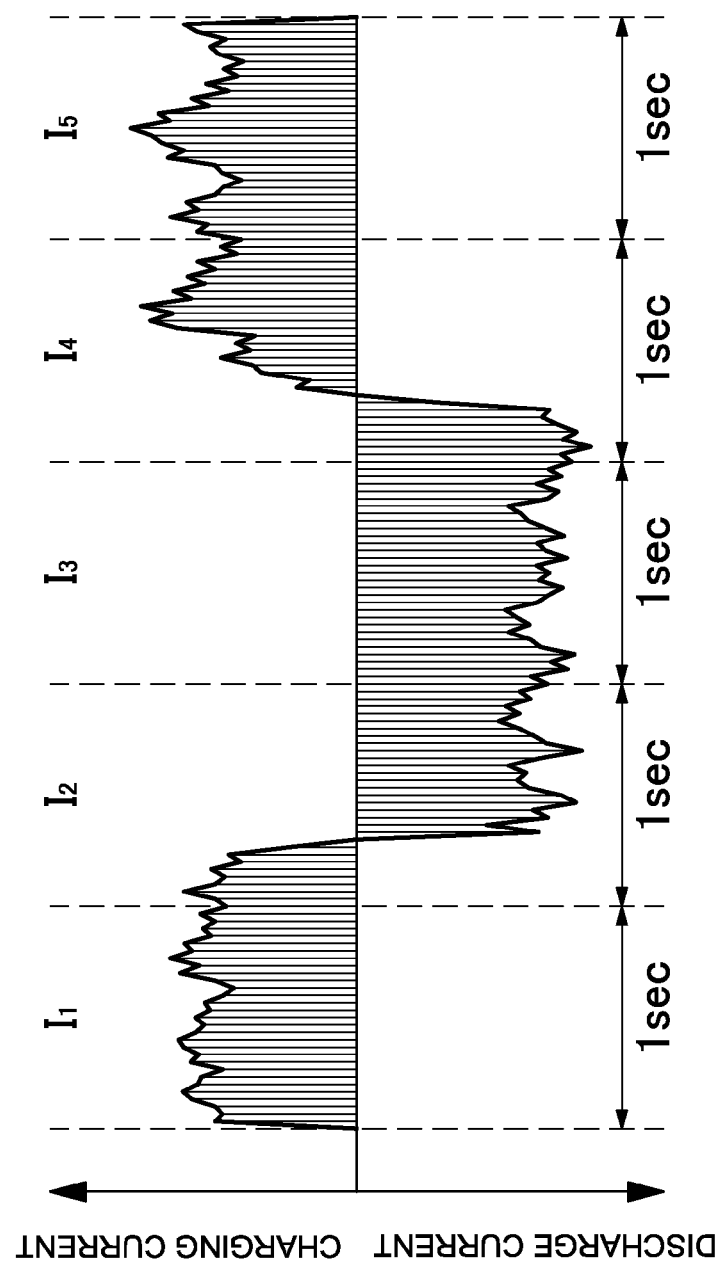
FIG. 3 is a graph showing an example of effective current (root-mean-squared current, $I_{rms}$) computation from a plurality of detected current values.

The effective current ($I_{rms}$) is computed from a plurality of sequentially detected current values. For example, as shown in FIG. 3, current values are detected with a 10 msec sampling period, and effective currents are computed for each 1 sec interval ($I_1, I_2, I_3, I_4, I_5, \ldots$). Battery 1 degradation level (SOH) is determined from each effective current ($I_{rms}$) computed from detected current values. The computation circuit 6 has a look-up-table or function stored in memory 7 that relates battery 1 degradation level (SOH) to corresponding effective current ($I_{rms}$) values. A decision circuit 2 that determines effective current ($I_{rms}$) values with a 1 sec periodicity detects and stores the battery 1 degradation level corresponding to the effective current ($I_{rms}$) that flows in each 1 sec interval. The computation circuit 6 sums the degradation level values stored in memory 7 to determine the battery 1 degradation level (SOH).

The computation circuit 6 can also determine degradation level (SOH) from cumulative effective current ($I_{rms}$) rather than determining battery 1 degradation level for each periodically detected effective current ($I_{rms}$). For example, a 1 min cumulative effective current value can be detected from the product of effective current ($I_{rms}$) and time, and the degradation level (SOH) can be determined from that cumulative value. The computation circuit 6 has a look-up-table or function stored in memory that relates battery 1 degradation level (SOH) to the cumulative effective current value, and the battery 1 degradation level (SOH) is detected from the recorded cumulative value.

Figure 4:
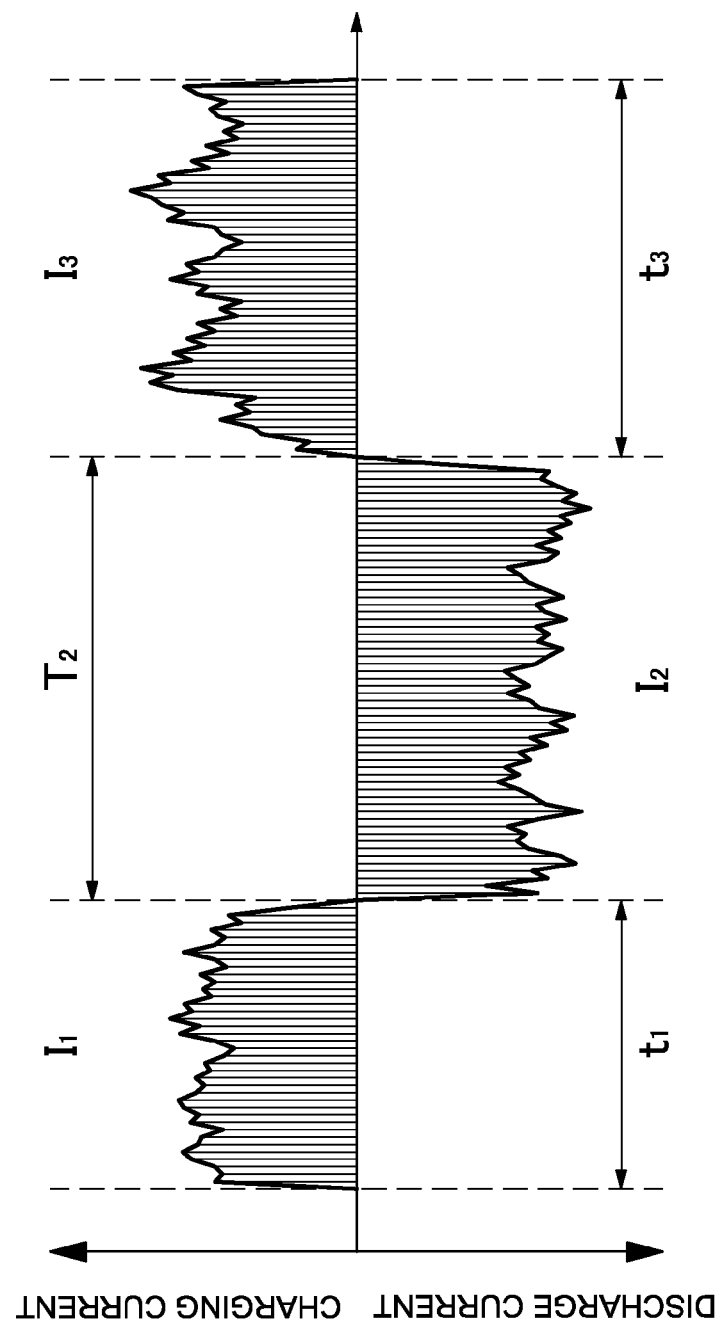
FIG. 4 is a graph showing another example of effective current ($I_{rms}$) computation from a plurality of detected current values.

The computation circuit 6 can also align the cumulative effective current ($I_{rms}$) time intervals with periods of charging and discharging, and the degradation level (SOH) can be determined from those cumulative effective current values. For example, as shown in FIG. 4, effective current ($I_{rms}$) can be accumulated during battery 1 discharging ($T_2$) and charging periods ($t_1, t_3$), and battery 1 degradation level (SOH) can be determined from those cumulative values. The computation circuit 6 has degradation level (SOH) corresponding to cumulative effective discharge current ($I_{rms}$) and cumulative effective charging current ($I_{rms}$) stored in memory 7. Battery 1 degradation level (SOH) is detected from the cumulative values stored in memory 7.

The computation circuit 6 can also average digital signal values detected by the current detection circuit 3 to detect average current, and compute effective current ($I_{rms}$) from the average current values. For example, the computation circuit 6 adds and averages a plurality of current values and computes effective current ($I_{rms}$) from the computed average current values. Further, the computation circuit 6 can compute average current values from a plurality of detected current values discarding the maximum and minimum values, and compute effective current ($I_{rms}$) from those amended average current values. This computation circuit 6 can detect battery 1 current accurately be discarding values that cannot be accurately detected due to conditions such as noise.

The decision circuit 2 can also determine battery 1 degradation level (SOH) from effective value of charging and discharging current ($I_{rms}$) flowing in the battery 1 and the accumulated time that current exceeds a preset current limit. The decision circuit 2 has battery degradation level stored in memory 7 corresponding to accumulated time exceeding the current limit, and the battery 1 degradation level (SOH) is detected from the degradation level that corresponds to the accumulated time stored in memory 7. The decision circuit 2 determines battery 1 degradation level (SOH) by adding the degradation level due to effective value of battery charging and discharging current ($I_{rms}$) and the degradation level due to battery 1 current exceeding the current limit.

The decision circuit 2 can also determine battery 1 degradation level (SOH) from the root-mean-square of the charging and discharging current and from the accumulated time that preset upper and lower voltage limits are exceeded. The decision circuit 2 has battery degradation level corresponding to accumulated time exceeding the upper and lower battery 1 voltage limits stored in memory 7, and the battery 1 degradation level (SOH) is determined from the degradation level that corresponds to the accumulated time stored in memory 7. The decision circuit 2 determines battery 1 degradation level (SOH) by adding the degradation level due to effective value of battery charging and discharging current ($I_{rms}$) and the degradation level detected from the accumulated time that battery 1 voltage exceeds the upper and lower voltage limits.

The decision circuit 2 can detect total battery 1 degradation level (SOH) by adding the degradation level detected from effective value of battery charging and discharging current ($I_{rms}$), the degradation level detected from the accumulated time that battery 1 current exceeds the current limit, and the degradation level detected from the accumulated time that battery 1 voltage exceeds the upper and lower voltage limits. Further, the decision circuit 2 can detect the degree of degradation due to battery 1 temperature to determine the degradation level (SOH) considering temperature-related deterioration as well.

In addition, the decision circuit 2 can detect the degree of degradation (SOH) by measuring internal battery 1 resistance. A decision circuit 2 that detects battery 1 degradation level (SOH) from internal resistance can determine both a first degradation level (SOH1) from detected values other than internal resistance and a second degradation level (SOH2) from the internal resistance. This decision circuit 2 does not simply add the first degradation level (SOH1) and the second degradation level (SOH2) to determine the degradation level (SOH), but rather determines total degradation level (SOH) from a weighted sum of the first degradation level (SOH1) and second degradation level (SOH2) according to the following equation:

Degradation level (SOH)=first weighting factor×
SOH1+second weighting factor×SOH2 where the sum of the first and second weighting factors is one.

Figure 5:
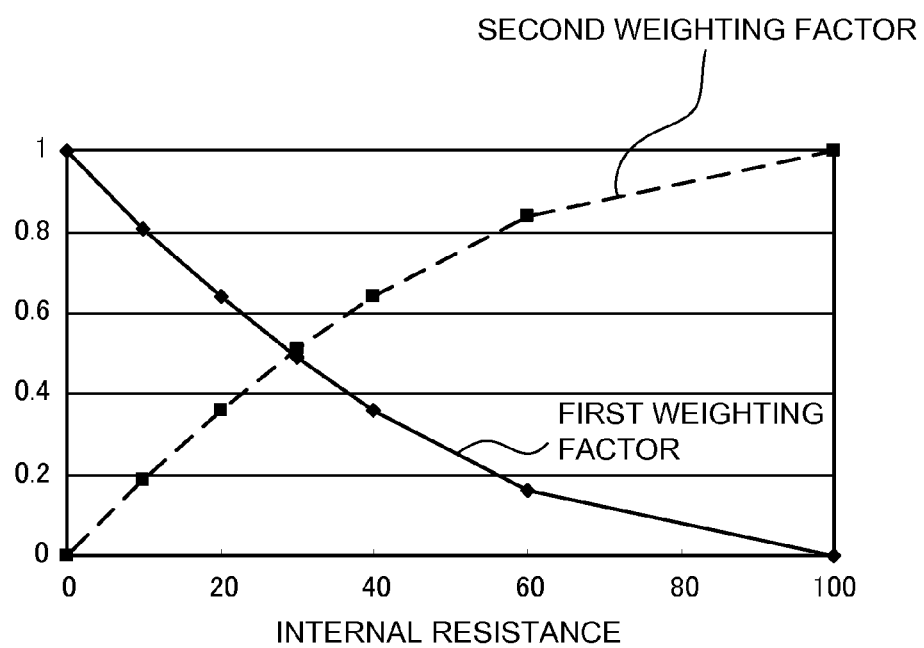
FIG. 5 is a graph showing the first weighting factor and the second weighting factor.

As shown by the graph in FIG. 5, the first weighting factor and second weighting factor are set according to the internal resistance. In this figure, the horizontal axis represents a relative value corresponding to the internal battery 1 resistance and the vertical axis indicates the first weighting factor and second weighting factor. In this figure, when the battery 1 degradation level (SOH) is 0%, which is when the battery 1 has reached the end of its lifetime, the relative internal resistance is set to 100. As shown in this figure, as battery 1 degradation proceeds and the degradation level (SOH) decreases (increased degradation), the first weighting factor decreases and the second weighting factor increases. This is because as internal resistance increases to put the battery 1 in a deteriorated state, the internal resistance accurately determines the degradation level (SOH). In this method, the first weighting factor and second weighting factor are set depending on the internal battery 1 resistance. However, the first weighting factor and second weighting factor can also be specified from the second degradation level (SOH2), which depends on internal battery 1 resistance, or from the total degradation level (SOH), which depends on the first degradation level (SOH1) and the second degradation level (SOH2). In that case, the first weighting factor is made small and the second weighting factor is made large as the second degradation level (SOH2) or the total degradation level (SOH) decreases, which is when battery 1 lifetime approaches its maximum value.

The decision circuit 2 can also determine the first degradation level (SOH1) from the following equation.

First degradation level (SOH1 [%])=previous SOH1
[%] value−SOH1 [%] due to factors such as current and temperature Battery 1 degradation increases with high battery temperature. Accordingly, the decision circuit 2 not only stores degradation level versus current data in memory 7, but also degradation level considering battery 1 degradation per unit time due to temperature. The decision circuit 2 detects degradation level (SOH) for a battery 1 that degrades over time from degradation level versus temperature data stored in memory 7.

For a battery 1 installed on-board a vehicle, when the ignition switch is in the ON state, which is when the vehicle is being operated, the decision circuit 2 detects parameters such as effective battery 1 current ($I_{rms}$), temperature, accumulated time exceeding the allowable current, and accumulated time exceeding the upper and lower voltage limits with given periodicity (for example, with a 10 sec period) to determine the battery 1 first degradation level (SOH1). However, the periodicity with which the decision circuit 2 computes the first degradation level (SOH1) is not limited to a 10 sec period and can be shorter or longer than 10 sec. For example, the period for determining the first degradation level (SOH1) can be 0.1 sec to 1 min, preferably 0.3 sec to 30 sec, and more preferably 0.3 sec to 10 sec. When the ignition switch is in the OFF state, the decision circuit 2 detects average battery 1 temperature over a several hour time period (for example, every 1 hr to 5 hrs) to compute the first degradation level (SOH1).

For a battery 1 charged by solar cells 20, battery 1 first degradation level (SOH1) is determined with a constant period such as 1 sec to 1 min.

Figure 6:
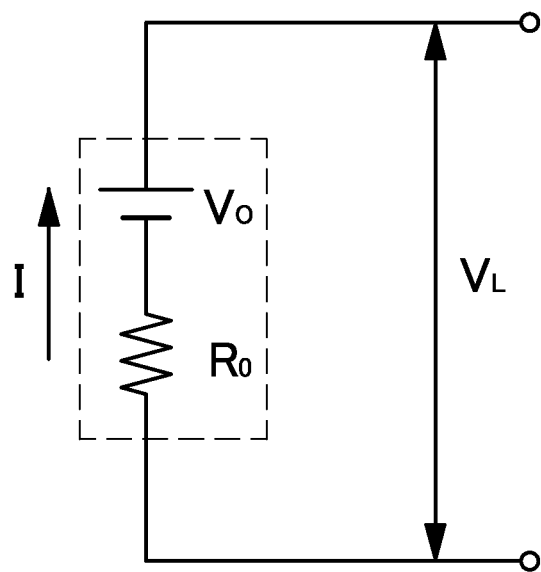
FIG. 6 is a circuit diagram showing an equivalent circuit of a battery with internal resistance.
Figure 7:
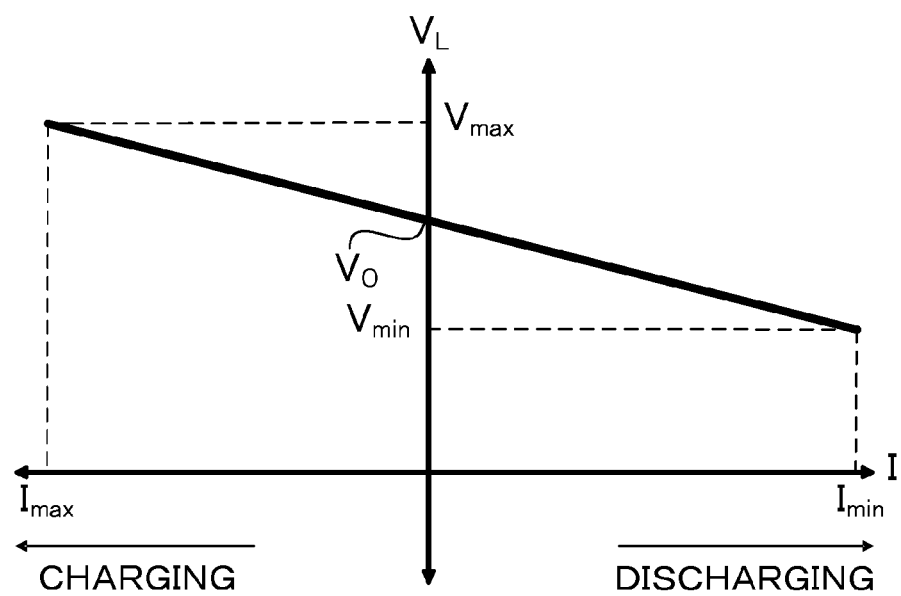
FIG. 7 is a graph showing battery current-voltage characteristics during charging and discharging.

The decision circuit 2 also detects internal battery 1 resistance and determines the second degradation level (SOH2) from the internal resistance. An equivalent circuit for a battery 1 with internal resistance is shown in FIG. 6. If the battery 1 in this equivalent circuit is charged and discharged, and the current I and output voltage VL are measured and plotted, a graph with the form of FIG. 7 results. In FIG. 7, the internal resistance R0 can be calculated from the slope of straight line, which represents the battery 1 current-voltage (I-V) characteristics. If the battery 1 open-circuit voltage is Vo and a voltage VL results when current I flows:

$$VL = Vo - R0 \times I$$

and rearranging that equation, internal resistance is computed as follows.

$$R0 = (Vo - VL)/I$$

Figure 8:
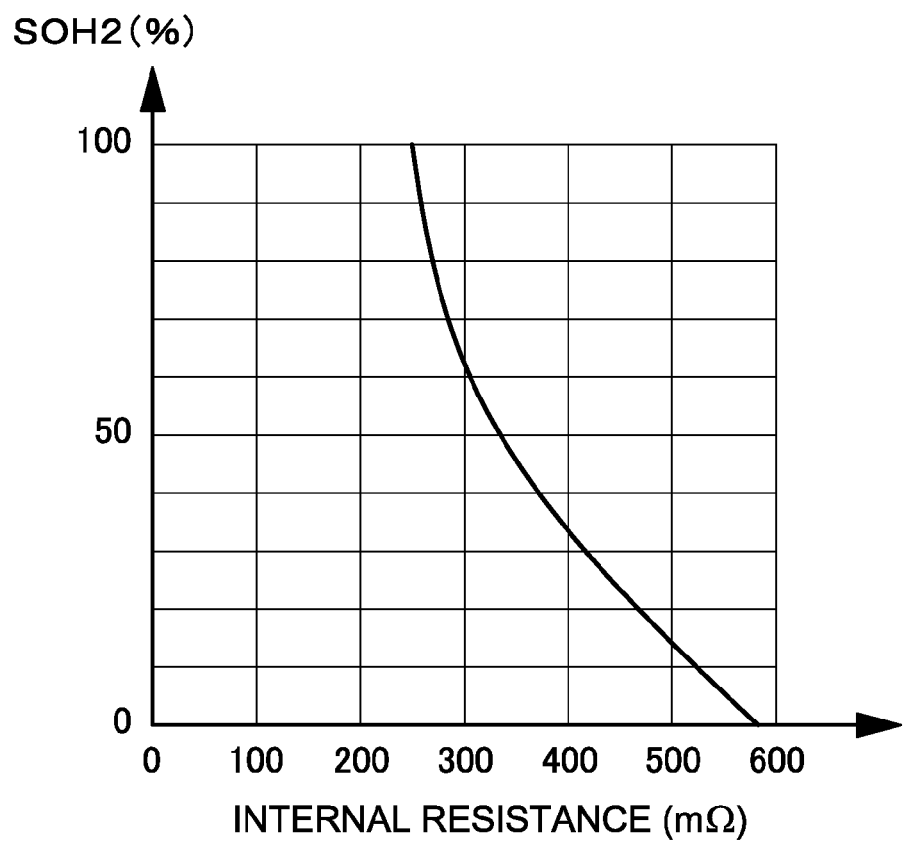
FIG. 8 is a graph showing the second degradation level (SOH2) as a function of internal battery resistance.

The second degradation level (SOH2) corresponding to internal battery 1 resistance is pre-stored as a look-up-table or as a function in the decision circuit 2. An example of second degradation level (SOH2) versus internal battery 1 resistance stored as a look-up-table or function is shown in graphical form in FIG. 8. A battery with the characteristics shown in this figure has a second degradation level (SOH2) of 60% when its internal resistance is 300 mΩ.

Figure 9:
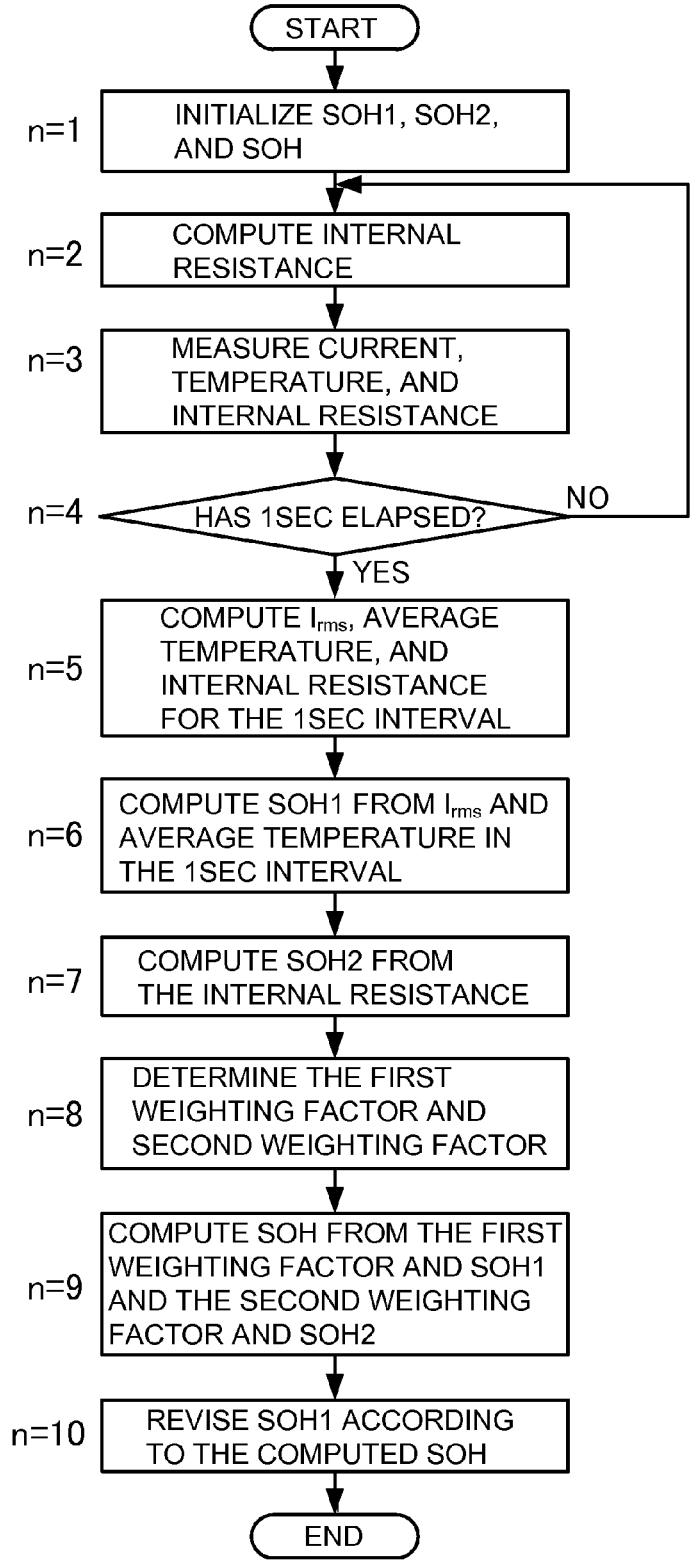
FIG. 9 is a flowchart of decision circuit computation of the degradation level (SOH).

A decision circuit 2 that detects the battery 1 degradation level (SOH) from a first degradation level (SOH1) and a second degradation level (SOH2) determines a first weighting factor and second weighting factor from the detected first degradation level (SOH1) and second degradation level (SOH2). A flowchart for decision circuit 2 computation of the degradation level (SOH) is shown in FIG. 9 and described as follows.

[Step n=1]

The decision circuit 2 sets initial values for the first degradation level (SOH1), the second degradation level (SOH2), and the degradation level (SOH) from data stored in internal memory 7.

[Step n=2]

The decision circuit 2 computes internal resistance from battery 1 current and voltage. Here, measurement accuracy is improved by compensating for temperature. This is because internal resistance varies as a function of temperature. Battery 1 temperature is measured when the internal resistance is detected, and the detected (temperature dependent) internal resistance is converted to internal resistance at a specified temperature. A decision circuit 2 that compensates internal resistance for temperature has internal resistance versus temperature stored in memory as a look-up-table or function. The internal resistance is corrected to internal resistance at a specified temperature according to the values stored in memory.

[Step n=3]

Battery 1 charging and discharging current, temperature, and internal resistance (compensated for temperature) are measured.

[Step n=4]

Control loops through steps n=2-4 until 1 sec has elapsed.

[Step n=5]

When 1 sec has elapsed, the effective current ($I_{rms}$), average temperature, and internal resistance are computed for that 1 sec interval.

[Step n=6]

The decision circuit 2 uses the effective current ($I_{rms}$) and average temperature in the 1 sec interval to determine the first degradation level (SOH1).

[Step n=7]

The decision circuit 2 determines the second degradation level (SOH2) from the internal resistance based on a look-up-table or function stored in memory.

[Step n=8]

The decision circuit 2 establishes the first weighting factor and second weighting factor for the first degradation level (SOH1) and second degradation level (SOH2). The first weighting factor and second weighting factor are established as shown in FIG. 5.

[Step n=9]

The decision circuit 2 computes overall battery 1 degradation level (SOH) from the first weighting factor and first degradation level (SOH1), and from the second weighting factor and second degradation level (SOH2).

[Step n=10]

Since the first degradation level (SOH1) approaches the overall degradation level (SOH) as degradation proceeds, the first degradation level (SOH1) is revised based on the computed degradation level (SOH).

In this manner, the decision circuit 2 determines the battery 1 degradation level (SOH) and sends the resulting SOH values to a control circuit 14 on the vehicle-side via the communication lines 9. By detecting the degradation level (SOH) in the manner described above, it is possible to know the battery 1 lifetime. Further, by pre-storing various characteristics (such as the relation of voltage, residual capacity, and full-charge capacity to the degradation level) for each degradation level (SOH), those stored characteristics can be used as required at the point in time when the degradation level (SOH) is determined.

The decision circuit 2 has a look-up-table or function stored in memory that indicates full-charge capacity (Ah) corresponding to the battery 1 degradation level (SOH). If full-charge capacity (Ah) is determined from the degradation level (SOH) for a battery 1 charged and discharged in a vehicle or solar cell application, residual capacity (SOC [%]) can be computed from the ratio of battery capacity that can be discharged (Ah) to the full-charge capacity (Ah). The battery capacity that can be discharged (Ah) is computed by integrating battery 1 charging and discharging current. Here, the capacity that can be discharged (Ah) is computed by subtracting the integrated value of discharge current from the integrated value of charging current. If the residual capacity (SOC [%]) is known, charging and discharging current can be controlled to keep the residual capacity (SOC [%]) within a given range. For example, charging and discharging current can be controlled to keep the residual capacity (SOC [%]) within a range of 30% to 70%, 20% to 80%, or 10% to 90% to reduce degradation and extend battery 1 lifetime.

Further, if battery 1 degradation level (SOH) is known, charging and discharging can be conducted while protecting the battery 1 according to its degradation level (SOH) by limiting the maximum current flow in the battery 1 or reducing the maximum voltage during charging.

The method of detecting battery degradation level of the present invention can be appropriately used in a power source apparatus in a vehicle such as a plug-in hybrid electric vehicle that can switch between an electric vehicle (EV) mode and a hybrid electric vehicle (HEV) mode, a hybrid (electric) vehicle, and an electric vehicle. The present invention can also be appropriately used in applications such as a server computer backup power source that can be rack-installed, a backup power source apparatus for a wireless base station such as a mobile phone base station, a power storage apparatus for the home or manufacturing facility, a streetlight power source, a power storage apparatus for use with solar cells, and a backup power source in systems such as traffic signals.

The invention claimed is:

1. A method of detecting battery degradation level, the method comprising:
   detecting charging and discharging current flow in the battery; and
   detecting battery degradation level (state of health, SOH) from effective current ($I_{rms}$), which is the root-mean-square of the charging and discharging current.

2. The method of detecting battery degradation level as cited in claim 1, wherein battery degradation level (SOH) is detected from a cumulative value of the effective value of charging and discharging current ($I_{rms}$) flow in the battery.

3. The method of detecting battery degradation level as cited in claim 2, wherein the cumulative value of the effective value of charging and discharging current ($I_{rms}$) is detected with a constant accumulation time.

4. The method of detecting battery degradation level as cited in claim 2, wherein the cumulative value of effective value of charging and discharging current ($I_{rms}$) is detected with accumulation times set coincident with charging and discharging time intervals.

5. The method of detecting battery degradation level as cited in claim 1, wherein battery degradation level (SOH) is detected from the effective battery charging and discharging current ($I_{rms}$) and accumulated time that a pre-set current limit is exceeded.

6. The method of detecting battery degradation level as cited in claim 1, wherein battery degradation level (SOH) is detected from the root-mean-square of the battery charging and discharging current ($I_{rms}$) and accumulated time that pre-set upper and lower voltage limits are exceeded.

7. The method of detecting battery degradation level as cited in claim 1, wherein battery charging and discharging current are measured with a sampling period of 1 msec to 1 sec to determine the root-mean-squared current.

8. The method of detecting battery degradation level as cited in claim 1, wherein battery charging and discharging is controlled within a pre-set residual capacity (state of charge, SOC) range.

9. The method of detecting battery degradation level as cited in claim 8 used in a battery that supplies power to a motor to drive a vehicle.

10. The method of detecting battery degradation level as cited in claim 8 applied to a battery used in a power source that stores solar cell power.

* * * * *